(12) United States Patent
Woo et al.

(10) Patent No.: US 7,390,757 B2
(45) Date of Patent: Jun. 24, 2008

(54) METHODS FOR IMPROVING LOW K FSG FILM GAP-FILL CHARACTERISTICS

(75) Inventors: Seong-Oh Woo, Pleasanton, CA (US); Jun Tae Choi, Suwon (KR)

(73) Assignee: Applied Materials, Inc., Santa Clara, CA (US)

( * ) Notice: Subject to any disclaimer, the term of this patent is extended or adjusted under 35 U.S.C. 154(b) by 225 days.

(21) Appl. No.: 11/280,141

(22) Filed: Nov. 15, 2005

(65) Prior Publication Data
US 2007/0111543 A1    May 17, 2007

(51) Int. Cl.
*H01L 21/31* (2006.01)
(52) U.S. Cl. .................. 438/786; 438/788; 257/E21.276
(58) Field of Classification Search ................. 438/786, 438/787, 788
See application file for complete search history.

(56) References Cited

U.S. PATENT DOCUMENTS

| | | | |
|---|---|---|---|
| 5,571,576 | A | 11/1996 | Qian et al. |
| 5,937,323 | A | 8/1999 | Orczyk et al. |
| 6,106,678 | A | 8/2000 | Shufflebotham et al. |
| 6,136,685 | A | 10/2000 | Narwankar et al. |
| 6,228,781 | B1 | 5/2001 | Murugesh et al. |
| 2002/0133258 | A1 | 9/2002 | Ngai et al. |
| 2002/0150682 | A1 | 10/2002 | M'Saad et al. |
| 2002/0155386 | A1* | 10/2002 | Xu et al. ...................... 430/312 |
| 2002/0173167 | A1* | 11/2002 | Krishnaraj et al. .......... 438/778 |
| 2002/0187655 | A1 | 12/2002 | Tan et al. |
| 2003/0209805 | A1 | 11/2003 | Choi et al. |
| 2004/0152341 | A1 | 8/2004 | Tan et al. |
| 2005/0048801 | A1 | 3/2005 | Karim et al. |

OTHER PUBLICATIONS

Qian et al, High Density Plasma Deposition and Deep Submicron Gap Fill WithLow Dielectric Constant SiOF, DUMIC Conference, Feb. 21-22, 1995.*

L. Q. Qian, H. W. Fry, G. Nobinger, J. T. Fye, M. C. Schmidt, J. Cassillas High Density Plasma Deposition and Deep Submicron Gap Fill with Low Dielectric Constant S1OF Films Feb. 21-22, 1995, DUMIC Conference 1995 ISMIC, pp. 50-56.

* cited by examiner

*Primary Examiner*—Alexander G Ghyka
(74) *Attorney, Agent, or Firm*—Townsend and Townsend and Crew

(57) ABSTRACT

The present invention relates to fluorinated silicate glass (FSG) with low dielectric constant and improved gap-fill characteristics. In the present method, a fluorinated silicon source, an optional fluorine source, an optional carbon source, a hydrogen source, and an oxygenator are used as the reactant gases. Inert or carrier gas(es) may also be used. In accordance with the present invention, the reactant gas mixture does not comprise a silane compound having the general formula $Si_xH_y$, wherein x has a range of 1 to 2, y has a range of 4 to 6. The material deposited is thus referred to herein alternatively as "$Si_xF_y$-only FSG" or "$Si_xF_y$-only fluorinated oxide" ("SOFO").

20 Claims, 5 Drawing Sheets

METHODS FOR IMPROVING LOW K FSG FILM GAP-FILL CHARACTERISTICS

BACKGROUND OF THE INVENTION

The present invention relates to the manufacture of integrated circuits, and more specifically, to methods, apparatus and systems for forming fluorinated silicate glass ("FSG") films with improved characteristics in a high-density-plasma chemical-vapor-deposition ("HDP-CVD") environment.

Semiconductor device geometries have dramatically decreased in size since such devices were first introduced several decades ago. Smaller feature sizes have resulted in the presence of increased aspect ratio gaps for some applications, for example, between adjacent conductive lines or in etched trenches. The aspect ratio of a gap is defined by the ratio of the gap's height or depth to its width. These spaces are difficult to fill using conventional methods. A film's ability to completely fill such gaps is referred to as the film's "gap-filling" ability. Silicon oxide is one type of insulation film that is commonly used to fill the gaps in intermetal dielectric (IMD) applications, premetal dielectric (PMD) applications and shallow trench isolation (STI) applications among others. Such a silicon oxide film is often referred to as a gap-fill film or a gap-fill layer.

Some integrated circuit manufacturers have turned to the use of high density plasma CVD (HDP-CVD) systems to deposit silicon oxide gap-fill layers. HDP-CVD systems form a plasma that is approximately two orders of magnitude or greater than the density of a standard, capacitively-coupled plasma CVD system. HDP-CVD systems generally operate at lower pressure ranges than low density plasma systems. The low chamber pressure employed in HDP-CVD systems provides active species having a long mean-free-path and reduced angular distribution. These factors, in combination with the plasma's density, contribute to a significant number of constituents from the plasma reaching even the deepest portions of closely spaced gaps, providing a film with improved gap-fill capabilities as compared to films deposited in a low density plasma CVD system.

Another factor that allows films deposited by HDP-CVD techniques to have improved gap-fill characteristics as compared to films deposited by other CVD techniques is the occurrence of sputtering, promoted by the plasma's high density, simultaneous with film deposition. The sputtering element of HDP deposition slows deposition on certain features, such as the corners of raised surfaces, thereby contributing to the increased gap-fill ability of HDP deposited films. Some HDP-CVD systems introduce argon or a similar heavy inert gas to further promote the sputtering effect. These HDP-CVD systems typically employ an electrode within the substrate support pedestal that enables the creation of an electric field to bias the plasma toward the substrate. The electric field can be applied throughout the HDP deposition process to generate sputtering and provide better gap-fill characteristics for a given film.

One HDP-CVD process commonly used to deposit a silicon oxide film forms a plasma from a process gas that includes silane ($SiH_4$), molecular oxygen ($O_2$) and argon (Ar). This silicon oxide film has improved gap-fill characteristics as opposed to some silicon oxide films deposited by other non-HDP-CVD plasma techniques and is useful for a variety of applications. Despite the improvement in gap-fill capability provided by HDP-CVD systems and the relatively good gap-fill characteristics of HDP-CVD silicon oxide films in particular, the development of film deposition techniques that enable the deposition of silicon oxide layers having even further improved gap-fill characteristics are desirable. Such improved silicon oxide film depositions are particularly desirable in light of the aggressive gap-fill challenges presented by integrated circuit designs employing minimum feature sizes of 0.18 microns and less.

One known way to improve the gap-fill capability of silicon oxide films is to add a fluorine-containing source gas to the process gas. Fluorine atoms are known to etch silicon oxide and it is known that the inclusion of fluorine into a silicon oxide deposition process results in etching simultaneous with deposition which in turn can improve the deposited film's gap-fill capability. The incorporation of fluorine into a silicon oxide film also has a primary benefit of reducing the dielectric constant of the deposited film. A silicon oxide film (also referred to as a silicate glass layer) that includes fluorine is often referred to in the industry as a fluorine-doped silicon oxide film or as a fluorosilicate glass (FSG) layer. However, a need exists to further lower the dielectric constant in the FSG film and improve gap-fill characteristics of the film.

BRIEF SUMMARY OF THE INVENTION

To address these and other needs, the present invention provides, in part, fluorinated silicon oxide films with low dielectric constants and improved gap-fill characteristics.

In a first aspect, a method of depositing a film on a substrate having a gap between adjacent raised surfaces is provided. The method generally comprises: (a) positioning a substrate in a deposition chamber, wherein said substrate comprises at least one gap formed between adjacent raised surfaces; (b) providing a gas mixture to the deposition chamber, wherein the gas mixture comprises a fluorinated silicon source, an fluorine source different from said fluorinated silicon source, a hydrogen source, and a oxidizer; and (c) reacting the gas mixture in the presence of an electric field to generate a plasma have an ion density of at least $10^{11}$ ions/$cm^3$ to thereby deposit a fluorine-containing silicon oxide film within said gap using a process having simultaneous deposition and sputtering components; wherein said gas mixture does not comprise a silane compound having the general formula $Si_yH_y$, wherein x has a range of 1 to 2, y has a range of 4 to 6. In one embodiment, the gas mixture may further comprises a carbon source or an inert or carrier gas.

In certain embodiments, the fluorine-containing silicon oxide layer has a dielectric constant less than about 3.5, preferably less than about 3.3. In other embodiments, the fluorine-containing silicon oxide layer is capable of filling gap geometries less than 70 nm.

In another aspect of the invention, a method of improving the gap-fill characteristics of a low k fluorine-containing silicon oxide film is provided. The method generally comprises: (a) providing a gas mixture comprising a fluorinated silicon source, a fluorine source different from said fluorinated silicon source, a hydrogen source, and a oxidizer to a high density plasma chemical vapor deposition (HDP-CVD) chamber for deposition of a low k fluorine-containing silicon oxide film on a substrate via high density plasma chemical vapor deposition (HDP-CVD); and (b) generating a plasma within said HDP-CVD chamber to thereby deposit said low k fluorine-containing silicon oxide film on said substrate; wherein said gas mixture does not comprise a silane compound having the general formula $Si_xH_y$, wherein x has a range of 1 to 2, y has a range of 4 to 6; and wherein said deposited low k fluorine-containing silicon oxide film exhibits improved gap-fill characteristics, as compared to films deposited without said gas mixture.

In yet another aspect of the invention, a second method of improving the gap-fill characteristics of a low k fluorine-containing silicon oxide film is provided. This method generally comprises: (a) providing a gas mixture comprising a fluorinated silicon source, a carbon source, a hydrogen source, and a oxidizer to a high density plasma chemical vapor deposition (HDP-CVD) chamber for deposition of a low k fluorine-containing silicon oxide film on a substrate via high density plasma chemical vapor deposition (HDP-CVD); and (b) generating a plasma within said HDP-CVD chamber to thereby deposit said low k fluorine-containing silicon oxide film on said substrate; wherein said gas mixture does not comprise a silane compound having the general formula $Si_xH_y$, wherein x has a range of 1 to 2, y has a range of 4 to 6; and wherein said deposited low k fluorine-containing silicon oxide film exhibits improved gap-fill characteristics, as compared to films deposited without said gas mixture.

These and other embodiments of the present invention along with many of its advantages and features are described in more detail in conjunction with the text below and attached figures.

DETAILED DESCRIPTION OF THE INVENTION

I. Introduction

Figure 1A:
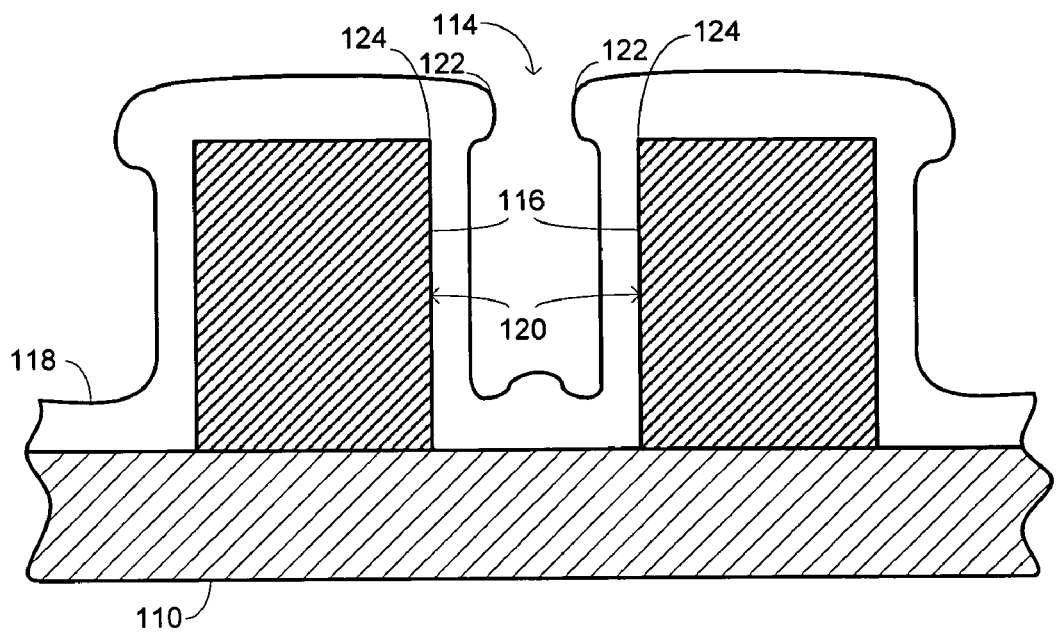
FIGS. 1A and 1B are schematic cross-sectional drawings illustrating the formation of a void during a gap-fill process.
Figure 1B:
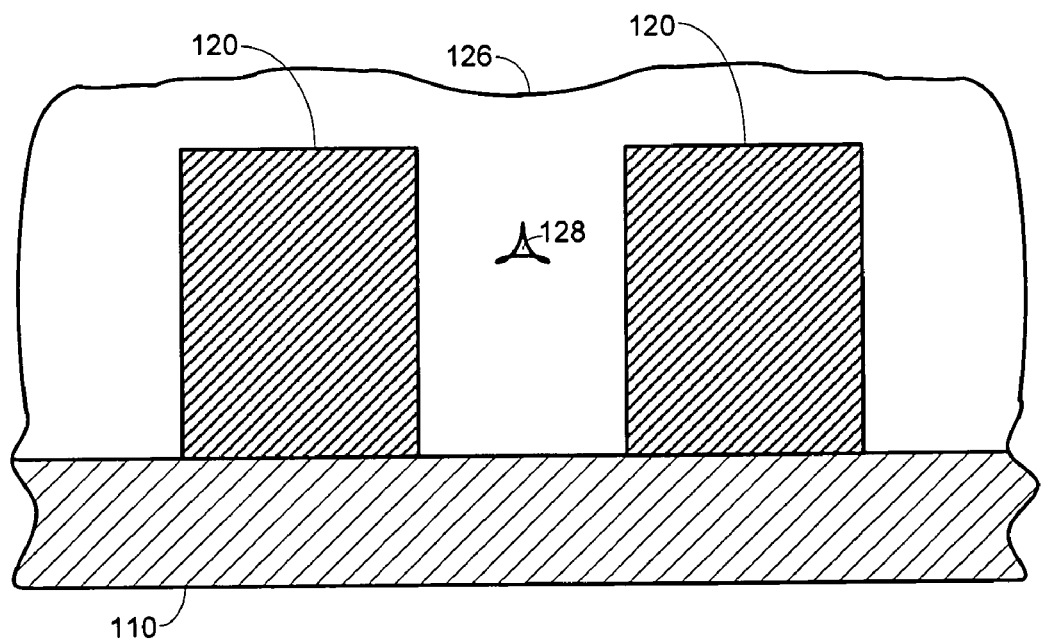

The gap-fill problem addressed by embodiments of the invention is illustrated schematically with the cross-sectional views shown in FIGS. 1A and 1B. FIG. 1A shows a vertical cross section of a substrate 110, such as may be provided with a semiconductor wafer, having a layer of features 120. Adjacent features define gaps 114 that are to be filled with dielectric material 118, with the sidewalls 116 of the gaps being defined by the surfaces of the features 120. As the deposition proceeds, dielectric material 118 accumulates on the surfaces of the features 120, as well as on the substrate 110 and forms overhangs 122 at the corners 124 of the features 120. As deposition of the dielectric material 118 continues, the overhangs 122 typically grow faster than the gap 114 in a characteristic bread-loafing fashion. Eventually, the overhangs 122 grow together to form the dielectric layer 126 shown in FIG. 1B, preventing deposition into an interior void 128.

CVD deposition of fluorinated silicon oxide films typically proceeds by flowing a process gas into a process chamber with the process gas comprising a silicon source, a fluorine source, and an oxidizing gas reactant. The silicon source typically comprises a silane compound such as $SiH_4$ and the oxidizing gas reactant typically comprises $O_2$. Sometimes an inert gas such as Ar may also be included as a fluent gas.

Improved gap-fill characteristics have generally been achieved using HDP-CVD because the high density of ionic species in the plasma during an HDP-CVD process causes there to be sputtering of a film even while it is being deposited. This combination of simultaneous sputtering and deposition tends to keep the gap open during deposition, although there remain limits to gap-fill capability with such processes.

The present invention relates to fluorinated silicate glass (FSG) with low dielectric constant and improved gap-fill characteristics as compared to traditional FSG films. In the present method, a fluorinated silicon source, an fluorine source different from the fluorinated silicon source and/or a carbon source, a hydrogen source, and an oxygenator are used as the reactant gases. Inert or carrier gas(es) may also be used. In accordance with the present invention, the reactant gas mixture does not comprise a silane compound having the general formula $Si_xH_y$, wherein x has a range of 1 to 2, y has a range of 4 to 6. The material deposited is thus referred to herein alternatively as "$Si_xF_y$-only FSG" or "$Si_xF_y$-only fluorinated oxide" ("SOFO").

Thus, in one embodiment, the invention relates to hydrogen assisted deposition of SOFO films. In accordance with one embodiment of the present invention, the SOFO film is deposited via a process having simultaneous hydrogen assisted plasma deposition and sputtering components. In another embodiment, the invention relates to fluorine assisted deposition of SOFO films. In yet another embodiment, the invention relates to carbon assisted deposition of SOFO films. Various combinations of these embodiments are also envisioned.

In some embodiments, the ratio of fluorinated silicon source to fluorine source may controlled to be at least about 3.0:1.0, to be between about 2.0:1.0 and 6.0:1.0, to be between about 3.0:1.0 and 6.0:1.0, and the like. In accordance with the invention, the use of such fluorinated silicon and fluorine levels decreases the dielectric constant of the resulting film and improves gap-fill characteristics. The further addition of a carbon source also decreases the dielectric constant of the resulting film and leads to improved gap-fill characteristics. In accordance with the methods of the invention, gap-fill at geometries less than 70 nm may be obtained. In some embodiments, the ratio of hydrogen source to fluorinated silicon source plus optional fluorine source may controlled to be at least about 7.5:1.0, to be between about 5.0:1.0 and 12.0:1.0, to be between about 6.0:1.0 and 10.0:1.0, and the like. Without intending to be limited by theory, the use of hydrogen helps reduce the amount of degradation of chamber components otherwise caused by the elimination of silane from the process recipe, e.g., by free fluorine. Hydrogen also serves to control in situ etchant properties of the fluorine, as described in further detail below.

II. Exemplary SOFO Film depostion

Figure 2A:
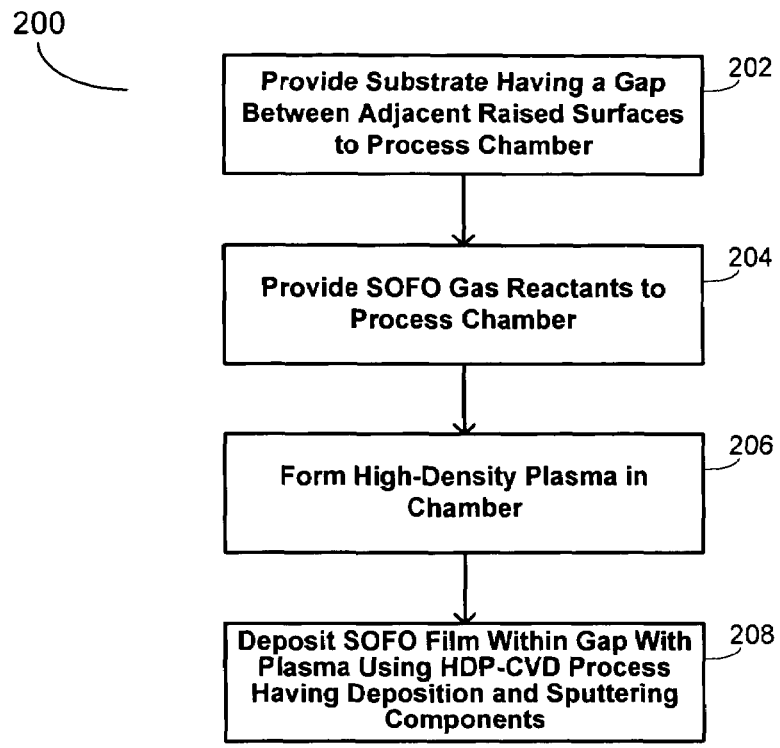
FIGS. 2A and 2B are flow diagrams illustrating methods for depositing an SOFO film or layer to fill a gap in embodiments of the invention.
Figure 2B:
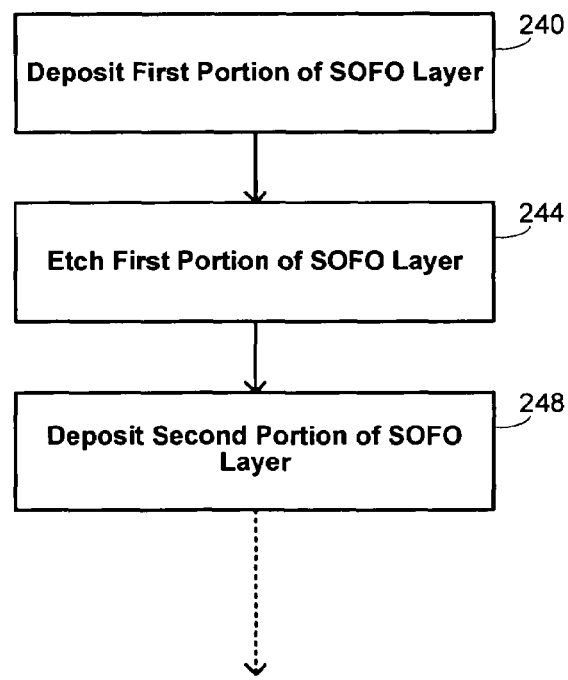
Figure 3:
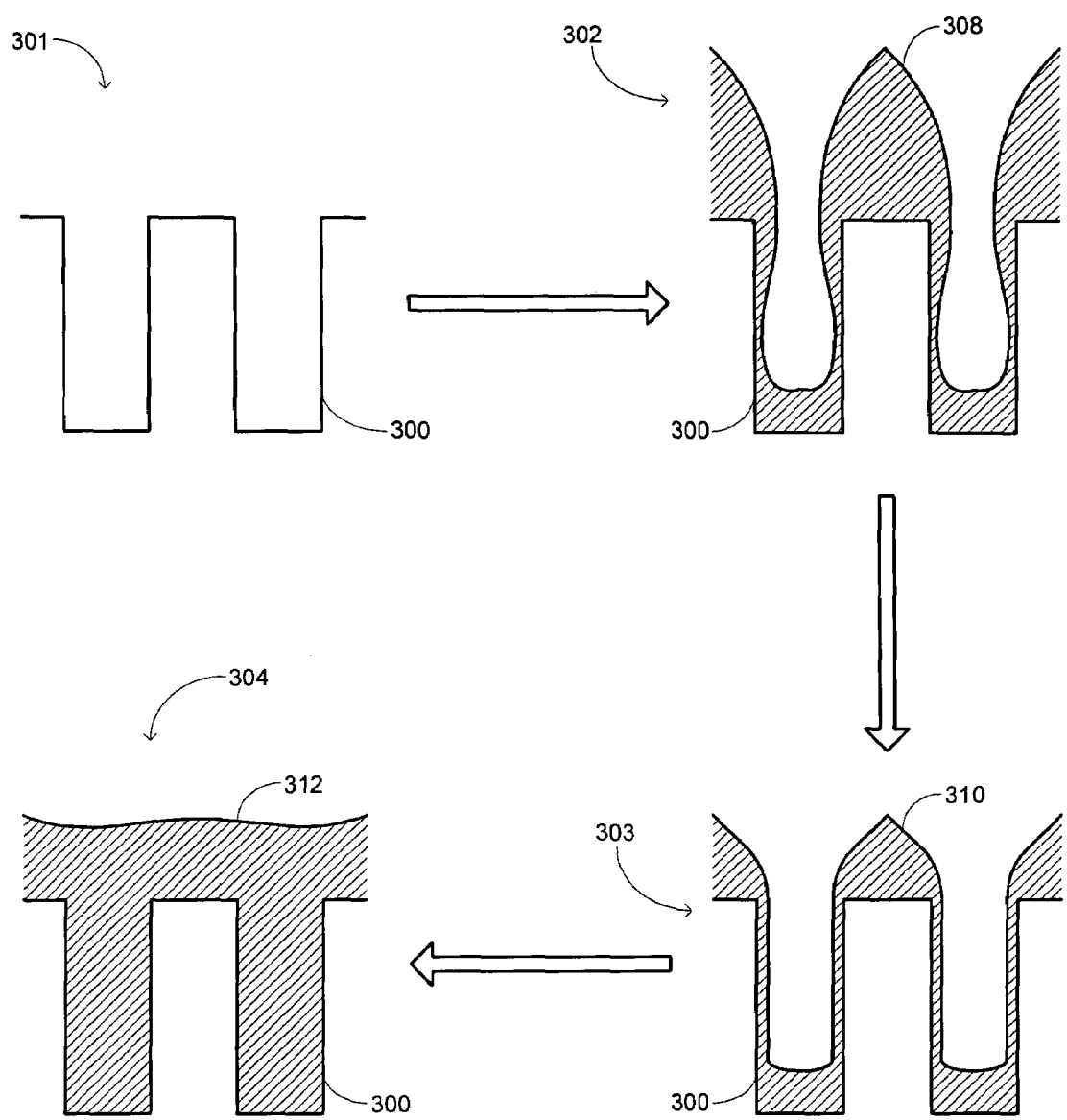
FIG. 3 provides schematic cross-sectional drawings illustrating how a high-aspect-ratio feature may be filled using a dep/etch/dep process according to an embodiment of the invention.
Figure 4A:
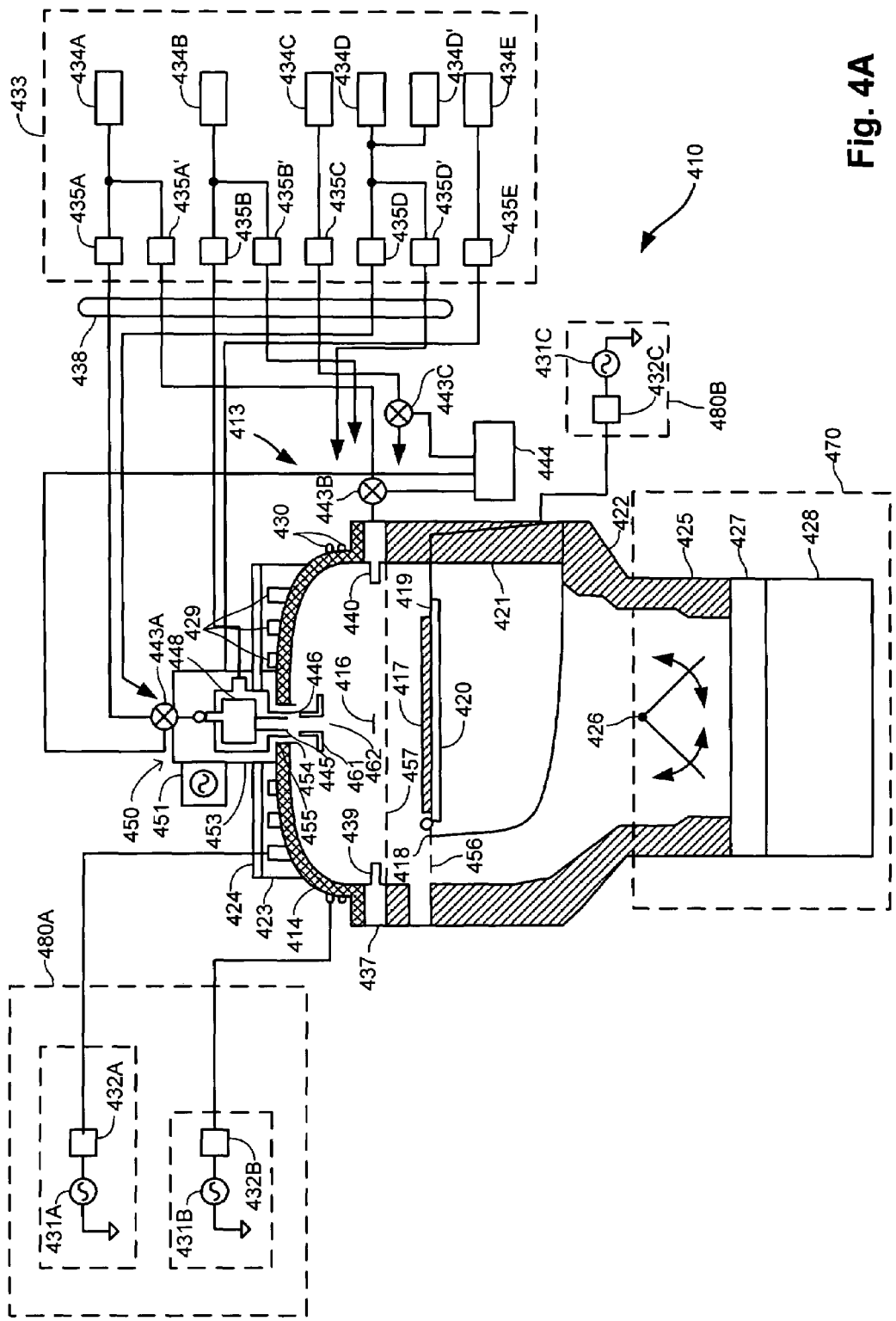
FIG. 4A is a simplified diagram of one embodiment of a high-density-plasma chemical-vapor-deposition system with which methods of the invention may be implemented.
Figure 4B:
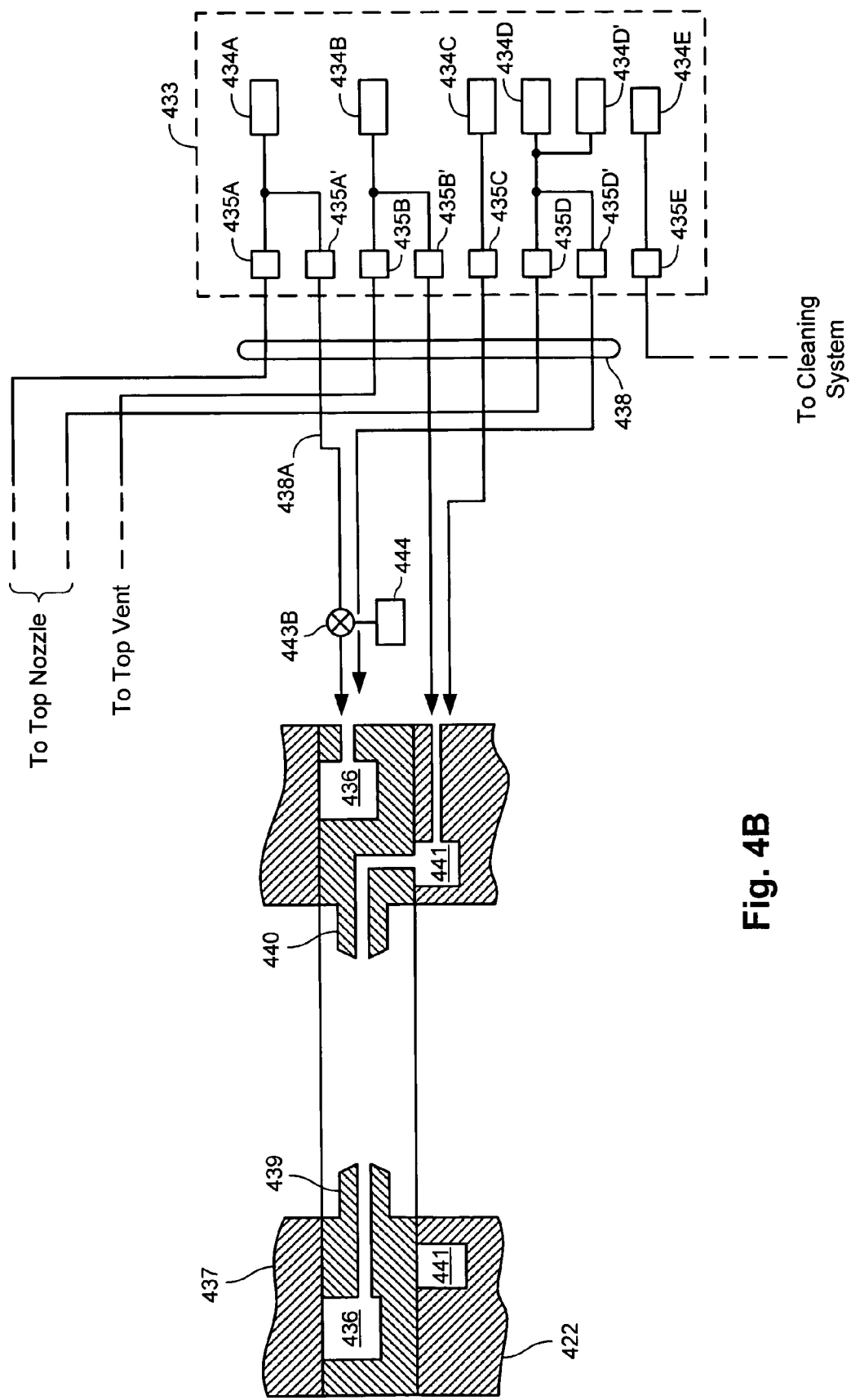
FIG. 4B is a simplified cross section of a gas ring that may be used in conjunction with the exemplary processing system of FIG. 4A.

The present invention deposits low k HDP-SOFO films with improved gap-fill characteristics. The method may be understood with reference to FIGS. 2A, 2B and 3, however it is not so limited. FIGS. 2A, 2B and 3 depict embodiments of the method of the present invention and a dielectric film so deposited. FIGS. 4A and 4B represent portions of a device useful for depositing dielectric films according to the embodiments of FIGS. 2A, 2B and 3, respectively. As previously stated, embodiments of the present invention can be practiced in an HDP-CVD chamber such as exemplary chamber described below with reference to FIGS. 4A and 4B. The process is for exemplary purposes only and is not intended to limit the scope of the claims of the present invention. Where applicable, reference numbers in the description below are used to refer to appropriate components of the exemplary chamber 413 of FIGS. 4A-4B.

The first embodiment of the method is best understood by simultaneously referring to FIGS. 2A and 3. FIG. 2A depicts a flow diagram for depositing an low k SOFO film 312 having improved gap-fill characteristics. The method 200 begins at Step 202, wherein a substrate is provided to chamber 413. At Step 204 a gaseous mixture including flows of a fluorinated silicon source, e.g., $SiF_4$, an optional fluorine source different from the fluorinated silicon source, e.g., $NF_3$, a hydrogen source, e.g., $H_2$, and an oxygenator, e.g., $O_2$, is introduced to a process chamber, such as chamber 413. The gas mixture may also include a carbon source, e.g., $CH_4$, but does not include a silane compound having the general formula $Si_xH_y$, wherein x has a range of 1 to 2, y has a range of 4 to 6. The carbon source may, in part, be used as a dopant to further reduce the dielectric constant of the resultant film.

The gaseous mixture is energized at Step 206 to form a plasma for depositing a SOFO film 312 on a substrate 300, such as a silicon substrate at Step 208. Preferably, the plasma is a high density plasma (HDP), i.e., a plasma having an ion density of approximately $10^{11}/cm^3$ or greater. By way of example, in an HDP chamber such as chamber 413, between 1500 and 8000 watts of RF power are applied to top coil 429 and between 3000 and 8000 watts are applied to side coil 430 for a 200 mm wafer. Bias power between 1000-3500 Watts may also be used if desired.

The substrate temperature is typically maintained at between about 100° C. and about 700° C. during SOFO deposition. Generally, the substrate is heated with the plasma using source RF power only. Sometimes, a low bias RF power (i.e., up to 500 watts) can be used for deposition temperature control using a closed loop with backside emissivity wafer temperature control. For example, a low bias power (up to 400 W for 200 mm wafers or ~1.3 W/cm$^2$) is sometimes used to heat-up epitaxial silicon (epi) wafers to the desired temperature during the process. Because of their very low resistivity, epi wafers cannot be heated with only source RF and a bias RF is necessary to help in heating up the wafer to the desired temperature. In addition, back side He cooling may optionally be used for process temperature control and targeting.

The flow rate of the fluorine source and/or the fluorinated silicon source during step 204 is optimized as described in more detail below to achieve the best results for any given gap-fill situation. In some embodiments that are used to fill particularly high aspect ratio gaps, the flow rates of the fluorine source and fluorinated silicon source are such that the combined fluorine content is higher than the silicon content. Furthermore, in some embodiments the ratio of the flow rate of the oxygen-source to the fluorinated silicon source is between about 1.4 and 3.0 to 1.0. Without intending to be limited by theory, at ratios below about 1.4:1.0 the silicon oxide film becomes silicon rich, and may exhibit poor electrical breakdown characteristics as well as undesirably high refractive index. At ratios above about 3.0:1.0, the relatively high gas flow rates required to achieve such ratios may increase the chamber pressure to undesirably high levels, which in turn degrades film gap-fill capabilities.

In certain embodiments, the fluorinated silicon source may be any suitable fluorinated silicon source such as a $Si_xF_y$ gas or liquid source compound, or combinations thereof, wherein x is 1 or 2 and y is 4 to 8, e.g., silicon tetrafluoride ($SiF_4$). The fluorine source may be any suitable fluorine source gas, such as carbon tetrafluoride ($CF_4$), fluoroethane ($C_2F_6$), trifluoromethane ($CHF_3$), difluoromethane ($CH_2F_2$), silicon tetrafluoride ($SiF_4$), nitrogen fluoride (NF3), and combinations thereof. The carbon source may be any suitable carbon source gas, such as methane ($CH_4$), ethane ($C_2H_6$), trifluoromethane ($CHF_3$), and combinations thereof Further, any suitable hydrogen source, e.g., $H_2$, and oxidizer, e.g., $O_2$, $N_2O$, $CO_2$, etc., known in the art may be used.

In some embodiments, an inert gas may also be supplied as a component of the process gas, such as a flow of He, Ne, or Ar. The level of sputtering provided by the hydrogen source or the inert gas is inversely related to their molecular or atomic mass, with, e.g., $H_2$ being used because it provides even less sputtering that He. Inclusion of an inert gas with the hydrogen source may, however, provide better deposition uniformity than use of the hydrogen source alone and may permit a significant cost saving. These benefits are realized even where the amount of hydrogen source used in the premixture is significantly greater than the amount of the inert gas. For example, in one embodiment, the premixture comprises greater than 95 wt % hydrogen source and in another embodiment comprises greater than 99 wt % hydrogen source. However, sufficient amounts of a hydrogen source should be used to counter the effects of the free fluorine, as described herein.

Table 1 below lists exemplary ranges for the primary deposition parameters in steps 204-208, except for deposition temperature, according to one embodiment of the present invention. The substrate may be continuously heated by the plasma during deposition step 208 to temperatures ranging from about 100° C. to about 700° C. In some embodiments, where the layer being deposited is for an STI application, no temperature control is used during deposition of the layer in step 208. Instead, the substrate is allowed to be heated to as high a temperature as possible by the plasma. Generally in these embodiments the substrate temperature reaches between 650° C. and 750° C. In some embodiments where the layer being deposited is for a PMD application, backside cooling is employed to maintain the temperature of the substrate between 450° C. and 750° C. and more typically between 500° C. and 600° C. However, the methods of the invention surprisingly result in desirably gap-fill characteristics at low temperatures also, e.g., ranging from about 100° C. to about 500° C. In Table 1 below, TVO means "throttle valve fully open" which results in chamber pressure being controlled by the quantity of gas flowed into the chamber.

| | |
|---|---|
| Fluorinated Silicon Source | 10 sccm to about 150 sccm |
| Fluorine Source, if present | 5 sccm to about 50 sccm<br>alternatively, at a fluorinated silicon source:fluorine source ratio of 3.0:1.0, between about 2.0:1.0 and 6.0:1.0, or between about 3.0:1.0 and 6.0:1.0 |
| Carbon Source, if present | 50 sccm to about 250 sccm<br>alternatively, at a carbon source:fluorinated silicon source ratio of 1.6:1.0, between about 1.0:1.0 and 4.0:1.0, or between about 0.4:1.0 and 3.0:1.0 |

| | -continued |
|---|---|
| Fluorinated Silicon Source | 10 sccm to about 150 sccm |
| Hydrogen Source | 100 sccm to about 1500 sccm<br>alternatively, at a hydrogen:fluorinated silicon source plus optional fluorine source ratio of 7.5:1.0, between about 5.0:1.0 and 12.0:1.0, or between about 6.0:1.0 and 10.0:1.0 |
| Oxidizer Source | 50 sccm to about 250 sccm<br>alternatively, at a oxidizer:fluorinated silicon source ratio of 1.4 and 3.0 to 1.0 |
| Pressure | 1-4 mTorr to 1 Torr to (TVO) |
| RF Power for a 200 mm wafer | 500 Watts-5000 Watts, e.g., 4000-5000 Watts (more aggressive gap-fill) 1300-4500 Watts (less aggressive gap-fill) |
| Side RF Power for a 200 mm wafer | 1800-4500 Watts (more aggressive gap-fill) 1800-4000 Watts (less aggressive gap-fill) |
| Bias RF Power for a 200 mm wafer | 1000-3500 Watts |

HDP-CVD deposition processes typically balance the flow of the deposition gas (e.g., silane in a silicon oxide process) with the bias power to optimize gap-fill capabilities of the film and still maintain an acceptable deposition rate. Generally and up to a limit, increasing the flow rate of the deposition gas results increases the deposition rate of the film to the detriment of the film's gap-fill capabilities, and increasing the bias power results in improved gap-fill capabilities at the expense of deposition rate. Thus, these two criteria are typically balanced, among others, in IMD, PMD, and STI applications to achieve optimal gap-fill results.

In one embodiment, chamber 413 contains at least some ceramic ($Al_2O_3$) components. In one particular embodiment, the gas mixture contains flows of $SiF_4$, NF3, $H_2$, $O_2$, and optionally $CH_4$. In one embodiment, flow rates for the deposition gases may range from about 10 to 150 standard cubic centimeters per minute (sccm) for $SiF_4$, from about 5 sccm to about 50 sccm for $NF_3$, from about 100 sccm to about 1500 sccm for $H_2$, and from about 50 to 250 sccm for $O_2$. The $CH_4$ may be provided at about 50 sccm to about 250 sccm. The chamber pressure is typically maintained at between about 3 and 10 millitorr. The chamber wall temperature is typically maintained at between about 60° C. and 170° C., and in one embodiment is about 75° C. Other flow rates, temperature ranges and pressure ranges also may be used.

By removing silane compounds (e.g., $SiH_4$) from the gaseous mixture or process recipe, the SOFO films deposited according to methods of the present invention have improved dielectric constants and gap-fill characteristics. In one embodiment, the SOFO layer has a dielectric constant that is between about 3.3 and 3.7. In alternative embodiments, the dielectric constant is less than about 3.5, less than about 3.4, less than about 3.3, or is about 3.3. Further, in certain embodiments, the SOFO films deposited according to the methods of the present invention can fill the gap geometries less than 70 nm, even at low temperatures.

By way of background, elimination of silane compounds from the gaseous mixture was generally believed to result in additional problems, e.g., the degradation of ceramic chamber components due to the fluorine content in the gaseous mixture. Silane-free gaseous mixtures used for forming SOFO films react according to the simplified reaction (1):

    (1)

The free fluorine in chamber 13 has an etch capability that reacts with the season layer and other parts of chamber 13. Reaction with the ceramic dome 14 forms $AlF_3$, causing a blackening of dome 14. The simplified reaction (2) for dome blackening is:

    (2)

Previous efforts focused on developing a $SiF_4$ only FSG process were unsuccessful in part due to blackening of the dome by free fluorine. To counteract these effects, the present invention provides that the gaseous mixture should include a hydrogen source to quench free fluorine. By suppressing the formation of free fluorides, ceramic chamber components are subject to less degradation. Further, use of a hydrogen source also acts to control relative deposition-to-etch ratio of fluorine in the process gas to control, e.g., corner clipping. The hydrogen source also reduces the concentration of fluorine atoms in the plasma to control aggressive etch components and also acts to reduce the incorporation of fluorine into the deposited film. In addition, the hydrogen source acts to reduce redeposition of fluorine-rich material and eliminates the accumulation of excess fluorine at redeposition sites that may otherwise occur without the addition of the hydrogen source. It also reduces the possibility of metal contamination in the film that may result from etching of material from the process chamber, such as Al contamination.

In this regard, in one embodiment, the addition of a fluorine source different from the fluorinated silicon source to the process gas in step 204 per the method of FIG. 2A, adds an isotropic ISEA component that reduces film growth on the sidewalls of gaps. This, in turn, allows a sustained bottom-up growth pattern without premature closing (i.e., void formation) of the gap. The fluorine species generated by the plasma etch the silicon oxide film isotropically, while the bias sputtering removes film anisotropically. Thus, the flow rate of the fluorine source provides an additional mechanism to control the film growth profile, especially within the gap, enabling optimization of a process to fill more aggressive gaps than previously possible without the addition of the fluorine source.

The amount of isotropic etching can be independently controlled by the flow rate of the fluorine source. This etching component should be balanced along with the fluorinated silicon source flow rate, the hydrogen flow rate, and bias power level to achieve an optimal, void free gap-fill process. Additionally in some embodiments, the fluorine flow is introduced after a thin layer of silicate glass is grown (deposited) in step 208. The growth of a thin silicon oxide layer without flowing fluorine helps avoid sidewall adhesion degradation and clipping of the upper corner of the gaps being filled due to isotropic etching.

While not being limited to any particular theory, it is believed that $NF_3$ is a preferred fluorine source different from the fluorinated silicon source, as compared to $SiF_4$, because $SiF_4$ includes additional film-forming elements (silicon) that counteract the etchant properties of the fluorine. Thus, the fluorine is incorporated into the film, rather than serving as an etchant. In this regard, temperatures above 450° C. may be preferred in certain embodiments of the invention, wherein fluorine from the fluorine source does not get incorporated into the deposited silicon oxide film. Other non-silicon fluorine sources that can be used to achieve superior gap-fill properties as compared to $SiF_4$ include fluorocarbons having a formula of $C_nF_{2n+2}$, where n is a positive integer such as $CF_4$, $C_2F_6$, $C_3F_8$, etc. Such fluorocarbons are less desirable in some embodiments used for STI applications because of their carbon content. Contrary to previous methodologies employing silane compounds as the silicone source, when used in connection with the fluorinated silicon sources of the present invention, it has been found that more aggressive nitrofluorinated etching gases or carbofluorinated etching gases may be used as in situ etchants without undesirable corner clipping or gap-fill profiles.

In some embodiments of the invention, the film deposition described in connection with FIG. 2A may correspond to one deposition step in a dep/etch/dep process. Such a dep/etch/dep process is illustrated with the flow diagram of FIG. 2B, in which deposition of first and second portions of the SOFO film as indicated at blocks 240 and 248 are separated by an intermediate etching of the first portion at block 244. Such etching may be performed in situ or remotely. In some instances, the etching may be also be preceded by a cooling step to lower the temperature of the substrate below about 250° C. and thereby provide better etch control. Such cooling may be performed, for example, by helium backside cooling of the substrate, among other methods. In certain in situ embodiments, a nitrofluorinated gas such as $NF_3$ or a carbofluorinated gas such as $C_2F_6$, $C_3F_8$, or $CF_4$, is flowed into the process chamber. Approximately 5-15% of the deposited thickness of the silicon oxide film may be removed during the etching step, although the amount removed may vary at different points according to the profile of the film. At least one of the deposition steps is performed with the deposition method described in connection with FIG. 2A. In a specific embodiment, that deposition method is used for the second of the deposition steps 248 shown in FIG. 2B. The dashed arrow in FIG. 2B is intended to indicate that the interleaving of depositing and etching steps may continue indefinitely, with more interleaved steps being used for more aggressive gap-fill applications.

In embodiments of the invention that use a dep/etch/dep process, care is taken not to damage the underlying structures during the etching step 244. This may be accomplished with a combination of effects that include ensuring that sufficient material is deposited during the first deposition step 240 to protect the underlying structures and that the etching conditions during the etching step 244 do not etch away so much material that the structures are exposed. The patterns that result from process parameters that are used to achieve this combination of effects are illustrated schematically in FIG. 3.

The specific order of the blocks shown in FIGS. 2A-2B are not intended to be restrictive and in other embodiments, additional steps may be performed.

The initial substrate structure 301 is shown schematically as including features 300 that are to be filled with a dielectric material. The process conditions for the first deposition may result in the formation of a significant cusp 308, as shown for intermediate structure 302, with dielectric material being deposited more thickly near the corners of the underlying structures than on the sidewalls. Structure 302 may result from deposition of a first SOFO film using the method described in connection with FIG. 2A. The cusp feature is protective during the subsequent etching step, which results in structure 303. Performing the etch anisotropically, such as by applying a bias during a reactive etch, helps to shape the deposited layer 310 so that the basic shape of the original features 300 are retained, but are less severe, with the corners of the underlying structures remaining unexposed. When the final deposition is performed, the features 300 may then be filled completely with dielectric material 312, such as shown schematically with structure 304.

III. Exemplary Substrate Processing System

FIGS. 4A and 4B illustrate one embodiment of a high density plasma chemical vapor deposition (HDP-CVD) system 10 in which a dielectric layer according to the present invention can be deposited. FIG. 4A schematically illustrates the structure of such an HDP-CVD system 410 in one embodiment. The system 410 includes a chamber 413, a vacuum system 470, a source plasma system 480A, a bias plasma system 480B, a gas delivery system 433, and a remote plasma cleaning system 450.

The upper portion of chamber 413 includes a dome 414, which is made of a ceramic dielectric material, such as aluminum oxide or aluminum nitride. Dome 414 defines an upper boundary of a plasma processing region 416. Plasma processing region 416 is bounded on the bottom by the upper surface of a substrate 417 and a substrate support member 418.

A heater plate 423 and a cold plate 424 surmount, and are thermally coupled to, dome 414. Heater plate 423 and cold plate 424 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 413 includes a body member 422, which joins the chamber to the vacuum system. A base portion 421 of substrate support member 418 is mounted on, and forms a continuous inner surface with, body member 422. Substrates are transferred into and out of chamber 413 by a robot blade (not shown) through an insertion/removal opening (not shown) in the side of chamber 413. Lift pins (not shown) are raised and then lowered under the control of a motor (also not shown) to move the substrate from the robot blade at an upper loading position 457 to a lower processing position 456 in which the substrate is placed on a substrate receiving portion 419 of substrate support member 418. Substrate receiving portion 419 includes an electrostatic chuck 420 that secures the substrate to substrate support member 418 during substrate processing. In a preferred embodiment, substrate support member 418 is made from an aluminum oxide or aluminum ceramic material.

Vacuum system 470 includes throttle body 425, which houses twin-blade throttle valve 426 and is attached to gate valve 427 and turbo-molecular pump 428. It should be noted that throttle body 425 offers minimum obstruction to gas flow, and allows symmetric pumping. Gate valve 427 can isolate pump 428 from throttle body 425, and can also control chamber pressure by restricting the exhaust flow capacity when throttle valve 426 is fully open. The arrangement of the throttle valve, gate valve, and turbo-molecular pump allow accurate and stable control of chamber pressures up to about 1 millitorr to about 2 torr.

The source plasma system 480A includes a top coil 429 and side coil 430, mounted on dome 414. A symmetrical ground shield (not shown) reduces electrical coupling between the coils. Top coil 429 is powered by top source RF (SRF) generator 431A, whereas side coil 430 is powered by side SRF generator 431B, allowing independent power levels and frequencies of operation for each coil. This dual coil system allows control of the radial ion density in chamber 413, thereby improving plasma uniformity. Side coil 430 and top coil 429 are typically inductively driven, which does not require a complimentary electrode. In a specific embodiment, the top source RF generator 431A provides up to 2,500 watts of RF power at nominally 2 MHz and the side source RF generator 431B provides up to 5000 watts of RF power at nominally 2 MHz. The operating frequencies of the top and side RF generators may be offset from the nominal operating frequency (e.g., to 1.7-1.9 MHz and 1.9-2.1 MHz, respectively) to improve plasma-generation efficiency.

A bias plasma system 480B includes a bias RF ("BRF") generator 431C and a bias matching network 432C. The bias plasma system 480B capacitively couples substrate portion 417 to body member 422, which act as complimentary electrodes. The bias plasma system 480B serves to enhance the transport of plasma species (e.g., ions) created by the source plasma system 480A to the surface of the substrate. In a specific embodiment, bias RF generator provides up to 10,000 watts of RF power at a frequency less than 5 MHz, as discussed further below.

RF generators 431A and 431B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 432A and 432B match the output impedance of generators 431A and 431B with their respective coils 429 and 430. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

A gas delivery system 433 provides gases from several sources, 434A-434E chamber for processing the substrate via gas delivery lines 438 (only some of which are shown). As would be understood by a person of skill in the art, the actual sources used for sources 434A-434E and the actual connection of delivery lines 438 to chamber 413 varies depending on the deposition and cleaning processes executed within chamber 413. Gases are introduced into chamber 413 through a gas ring 437 and/or a top nozzle 445. FIG. 4B is a simplified, partial cross-sectional view of chamber 413 showing additional details of gas ring 437.

In one embodiment, first and second gas sources, 434A and 434B, and first and second gas flow controllers, 435A' and 435B', provide gas to ring plenum 436 in gas ring 437 via gas delivery lines 438 (only some of which are shown). Gas ring 437 has a plurality of source gas nozzles 439 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 437 has 12 source gas nozzles made from an aluminum oxide ceramic.

Gas ring 437 also has a plurality of oxidizer gas nozzles 440 (only one of which is shown), which in a preferred embodiment are co-planar with and shorter than source gas nozzles 439, and in one embodiment receive gas from body plenum 441. In some embodiments it is desirable not to mix source gases and oxidizer gases before injecting the gases into chamber 413. In other embodiments, oxidizer gas and source gas may be mixed prior to injecting the gases into chamber 413 by providing apertures (not shown) between body plenum 441 and gas ring plenum 436. In one embodiment, third, fourth, and fifth gas sources, 434C, 434D, and 434D', and third and fourth gas flow controllers, 435C and 435D', provide gas to body plenum via gas delivery lines 438. Additional valves, such as 443B (other valves not shown), may shut off gas from the flow controllers to the chamber. In implementing certain embodiments of the invention, source 434A comprises a fluorinated silicon source, source 434B comprises a molecular oxygen $O_2$ source, source 434C comprises a fluorine source, source 434D comprises a helium He source, and source 434D' comprises a molecular hydrogen $H_2$ source.

In embodiments where flammable, toxic, or corrosive gases are used, it may be desirable to eliminate gas remaining in the gas delivery lines after a deposition. This may be accomplished using a 3-way valve, such as valve 443B, to isolate chamber 413 from delivery line 438A and to vent delivery line 438A to vacuum foreline 444, for example. As shown in FIG. 4A, other similar valves, such as 443A and 443C, may be incorporated on other gas delivery lines. Such three-way valves may be placed as close to chamber 413 as practical, to minimize the volume of the unvented gas delivery line (between the three-way valve and the chamber). Additionally, two-way (on-off) valves (not shown) may be placed between a mass flow controller ("MFC") and the chamber or between a gas source and an MFC.

Referring again to FIG. 4A, chamber 413 also has top nozzle 445 and top vent 446. Top nozzle 445 and top vent 446 allow independent control of top and side flows of the gases, which improves film uniformity and allows fine adjustment of the film's deposition and doping parameters. Top vent 446 is an annular opening around top nozzle 445. In one embodiment, first gas source 434A supplies source gas nozzles 439 and top nozzle 445. Source nozzle MFC 435A' controls the amount of gas delivered to source gas nozzles 439 and top nozzle MFC 435A controls the amount of gas delivered to top gas nozzle 445. Similarly, two MFCs 435B and 435B' may be used to control the flow of oxygen to both top vent 446 and oxidizer gas nozzles 440 from a single source of oxygen, such as source 434B. In some embodiments, oxygen is not supplied to the chamber from any side nozzles. The gases supplied to top nozzle 445 and top vent 446 may be kept separate prior to flowing the gases into chamber 413, or the gases may be mixed in top plenum 448 before they flow into chamber 413. Separate sources of the same gas may be used to supply various portions of the chamber.

A remote microwave-generated plasma cleaning system 450 is provided to periodically clean deposition residues from chamber components. The cleaning system includes a remote microwave generator 451 that creates a plasma from a cleaning gas source 434E (e.g., molecular fluorine, nitrogen trifluoride, other fluorocarbons or equivalents) in reactor cavity 453. The reactive species resulting from this plasma are conveyed to chamber 413 through cleaning gas feed port 454 via applicator tube 455. The materials used to contain the cleaning plasma (e.g., cavity 453 and applicator tube 455) must be resistant to attack by the plasma. The distance between reactor cavity 453 and feed port 454 should be kept as short as practical, since the concentration of desirable plasma species may decline with distance from reactor cavity 453. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 420, do not need to be covered with a dummy wafer or otherwise protected, as may be required with an in situ plasma cleaning process. In FIG. 4A, the plasma-cleaning system 450 is shown disposed above the chamber 413, although other positions may alternatively be used.

A baffle 461 may be provided proximate the top nozzle to direct flows of source gases supplied through the top nozzle into the chamber and to direct flows of remotely generated plasma. Source gases provided through top nozzle 445 are directed through a central passage 462 into the chamber, while remotely generated plasma species provided through the cleaning gas feed port 454 are directed to the sides of the chamber 413 by the baffle 461.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in the commonly assigned U.S. Pat. No. 6,170,428, entitled "Symmetric Tunable Inductively-Coupled HDP-CVD Reactor," the disclosure of which is incorporated herein by reference. The described system is for exemplary purpose only. It would be a matter of routine skill for a person of skill in the art to select an appropriate conventional substrate processing system and computer control system to implement the present invention.

Those of ordinary skill in the art will realize that specific parameters can vary for different processing chambers and different processing conditions, without departing from the spirit of the invention. Other variations will also be apparent to persons of skill in the art. These equivalents and alternatives are intended to be included within the scope of the present invention. Therefore, the scope of this invention should not be limited to the embodiments described, but should instead be defined by the following claims.

What is claimed is:

1. A method of depositing a film on a substrate having a gap between adjacent raised surfaces, said method comprising:
   (a) positioning a substrate in a deposition chamber, wherein said substrate comprises at least one gap formed between adjacent raised surfaces;
   (b) providing a gas mixture to the deposition chamber, wherein the gas mixture comprises a fluorinated silicon source, a fluorine source different from said fluorinated silicon source, a hydrogen source, and a oxidizer; and
   (c) reacting the gas mixture in the presence of an electric field to generate a plasma having an ion density of at least $10^{11}$ ions/cm$^3$ to thereby deposit a fluorine-containing silicon oxide film within said gap using a process having simultaneous deposition and sputtering components;
   wherein said gas mixture does not comprise a silane compound having the general formula $Si_xH_y$, wherein x has a range of 1 to 2, y has a range of 4 to 6.

2. The method of claim 1, wherein said gas mixture further comprises a carbon source.

3. The method of claim 2, wherein the carbon source is selected from the group consisting of: methane ($CH_4$), ethane ($C_2H_6$), trifluoromethane ($CHF_3$), and combinations thereof.

4. The method of claim 1, wherein the fluorinated silicon source is silicon tetrafluoride ($SiF_4$).

5. The method of claim 1, wherein the fluorine source is selected from the group consisting of: carbon tetrafluoride ($CF_4$), fluoroethane ($C_2F_6$), trifluoromethane ($CHF_3$), difluoromethane ($CH_2F_2$), silicon tetrafluoride ($SiF_4$), nitrogen fluoride ($NF_3$), and combinations thereof.

6. The method of claim 1, wherein the gas mixture further comprises an inert gas.

7. The method of claim 6, wherein the inert gas is selected from the group of helium (He), argon (Ar), neon (Ne), and combinations thereof.

8. The method of claim 1, wherein the hydrogen source: fluorinated silicon source plus optional fluorine source ratio in the gas mixture is in a range of about 5.0:1.0 and 12.0:1.0.

9. The method of claim 1, wherein the substrate is heated to a temperature in a range of about 100° C. to about 700° C.

10. The method of claim 1, wherein the deposition chamber is maintained at a pressure between about 1 mTorr to about 1 Torr.

11. The method of claim 1, wherein the silicon source is provided to the deposition chamber at a flow rate in a range of about 10 sccm to about 150 sccm.

12. The method of claim 1, wherein the fluorine source is provided to the deposition chamber at a flow rate in a range of about 5 sccm to about 50 sccm.

13. The method of claim 1, wherein the hydrogen source is provided to the deposition chamber at a flow rate in a range of about 100 sccm to about 1500 sccm.

14. The method of claim 1, wherein the oxidizer is provided to the deposition chamber at a flow rate in a range of about 50 sccm to about 250 sccm.

15. The method of claim 2, wherein the carbon source is provided to the deposition chamber at a flow rate in a range of about 50 sccm to about 250 sccm.

16. The method of claim 1 wherein the electric field is generated from one or more radio frequency (RF) powers within a range of about 500 W to about 5000 W for a 200 mm substrate.

17. The method of claim 1 wherein the fluorine-containing silicon oxide layer has a dielectric constant less than about 3.5.

18. The method of claim 1 wherein the fluorine-containing silicon oxide layer is capable of filling a gap beyond 70 nm.

19. A method of improving the gap-fill characteristics of a low k fluorine-containing silicon oxide film, said method comprising:
  (a) providing a gas mixture comprising a fluorinated silicon source, a fluorine source different from said fluorinated silicon source, a hydrogen source, and a oxidizer to a high density plasma chemical vapor deposition (HDP-CVD) chamber for deposition of a low k fluorine-containing silicon oxide film on a substrate via high density plasma chemical vapor deposition (HDP-CVD); and
  (b) generating a plasma within said HDP-CVD chamber to thereby deposit said low k fluorine-containing silicon oxide film on said substrate;
  wherein said gas mixture does not comprise a silane compound having the general formula $Si_xH_y$, wherein x has a range of 1 to 2, y has a range of 4 to 6; and
  wherein said deposited low k fluorine-containing silicon oxide film exhibits improved gap-fill characteristics, as compared to films deposited without said gas mixture.

20. A method of improving the gap-fill characteristics of a low k fluorine-containing silicon oxide film, said method comprising:
  (a) providing a gas mixture comprising a fluorinated silicon source, a fluorine source different from said fluorinated silicon source, a carbon source, a hydrogen source, and a oxidizer to a high density plasma chemical vapor deposition (HDP-CVD) chamber for deposition of a low k fluorine-containing silicon oxide film on a substrate via high density plasma chemical vapor deposition (HDP-CVD); and
  (b) generating a plasma within said HDP-CVD chamber to thereby deposit said low k fluorine-containing silicon oxide film on said substrate;
  wherein said gas mixture does not comprise a silane compound having the general formula $Si_xH_y$, wherein x has a range of 1 to 2, y has a range of 4 to 6; and
  wherein said deposited low k fluorine-containing silicon oxide film exhibits improved gap-fill characteristics, as compared to films deposited without said gas mixture.

* * * * *